United States Patent

Tseng et al.

[19]

[11] Patent Number: 5,882,962
[45] Date of Patent: Mar. 16, 1999

[54] METHOD OF FABRICATING MOS TRANSISTOR HAVING A P+-POLYSILICON GATE

[75] Inventors: Kuo-Shu Tseng, Hsinchu; Chi-Hua Yu, Kaohsung, both of Taiwan

[73] Assignee: Vanguard International Semiconductor Corporation, Hsinchu, Taiwan

[21] Appl. No.: 688,168

[22] Filed: Jul. 29, 1996

[51] Int. Cl.⁶ .................. H01L 21/336; H01L 21/8234
[52] U.S. Cl. ............................................................. 438/197
[58] Field of Search ............................ 438/197, 587, 438/592

[56] References Cited

U.S. PATENT DOCUMENTS 4,637,836  1/1987  Flatley et al. ............................ 438/585
5,464,789  11/1995  Saito ...................................... 438/217

Primary Examiner—Charles Bowers
Assistant Examiner—Craig Thompson
Attorney, Agent, or Firm—Christensen O'Connor Johnson & Kindness PLLC

[57] ABSTRACT

A method of forming a MOS transistor having a $p^+$-polysilicon gate includes doping an amorphous silicon layer with phosphorus, thereby forming a $n^-$ amorphous silicon layer atop of a gate oxide. The $n^-$ amorphous silicon layer is then doped with boron to convert the $n^-$ amorphous silicon layer into a $p^+$-amorphous silicon layer. The $p^+$-amorphous silicon layer is then thermally treated to convert the $p^+$-amorphous silicon layer into a $p^+$-polysilicon layer. The $p^+$-polysilicon layer is then patterned into a gate for a MOS transistor. The phosphorus ions in the $p^+$-polysilicon help to fix the boron ions in the polysilicon gate, thereby reducing the diffusion of the boron ions and penetration of boron into the gate oxide.

6 Claims, 6 Drawing Sheets

METHOD OF FABRICATING MOS TRANSISTOR HAVING A P+-POLYSILICON GATE

RELATED PATENT APPLICATION

"Method for fabrication of W-polycide-to-poly capacitors with high linearity", inventors Shun-Liang Hsu; Chun-Yi Shi; Mou-Shiung Lin Patent No. 5338701, filing date Nov. 3, 1993.

FIELD OF THE INVENTION

The present invention relates to methods of fabricating metal oxide semiconductor (MOS) transistors and, more specifically, to methods of fabricating MOS transistors having a p+-polysilicon gate.

BACKGROUND

Semiconductor technologies continue to improve and increase the integrated circuit density on a chip. As described below, special problems arise when increasing the density of MOS transistors. As is well known, a MOS transistor is a device in which a current in a conducting channel between a source and a drain is modulated by a voltage applied to a gate. In a p-channel MOS (PMOS) transistor, the majority of carriers are holes. Thus, a negative voltage is applied on the gate to form the conductive p-channel. However, the gate voltage must reach a level called the threshold voltage in order for the channel region to conduct. The threshold voltage is dependent in part on the conductivity of the MOS transistor's gate.

Polysilicon is a standard gate material and is typically deposited on a semiconductor substrate between a drain and source region using a chemical vapor deposition (CVD) process. For a p-channel MOS transistor, the polysilicon deposition is commonly followed by a boron diffusion to dope the polysilicon gate and thereby lower its resistivity. To obtain faster devices and a low resistance gate, various silicides are used in forming the gate. For example, a combination of polysilicon and a refractory metal silicide layers (i.e., polycide) are often used in forming the gate. Polycide has resistivity and temperature advantages that make its use very important as the industry moves to smaller device geometric. However, the use of boron as a dopant to adjust threshold voltage of a p-channel device becomes less feasible as devices use even thinner gate oxide because larger doses of boron are needed, which makes the gate oxide more susceptible to boron contamination. In addition, buried channel devices are subject to more process variability stemming from the difficulty of controlling the compensating doping.

As stated above, a problem encountered with p+-polysilicon gates is the poor threshold voltage process control in the PMOS devices, due to penetration of boron into the gate oxide. For example, boron will penetrate gate oxide that is thinner than 125 angstroms thick during a 30 minute post-implant anneal in a nitrogen gas ambient at 900° C. (see S. Wolf "Silicon Processing for the VLSI Era" Vol. 3). It is also been found that the presence of fluorine in the gate oxide worsens the boron penetration problem. Fluorine can be introduced into the gate oxide when the PMOS source drain regions are implanted using BF.

SUMMARY

In accordance with the present invention, a method of manufacturing MOS transistor having a p+-polysilicon gate is provided. In one embodiment, phosphorus ions are used to dope the polysilicon gate. Then boron is implanted in the polysilicon gate by using a BF ion implantation process. The phosphorus ions in the polysilicon gate help to fix the boron in the polysilicon gate, thereby reducing the diffusion of the boron and penetration of the boron into the gate oxide.

In an embodiment adapted for fabricating PMOS transistors, a first silicon dioxide layer is formed on a semiconductor substrate. Then, an amorphous silicon layer is formed over the first silicon dioxide layer. The amorphous silicon layer is doped by diffusion with phosphorus to form a lightly doped n type (n-) silicon layer. Next, a tungsten silicide layer is formed over the silicon layer. An ion implantation is performed to dope the amorphous silicon layer into a p+-amorphous silicon layer. The implantation is performed through the tungsten silicide layer and into the silicon layer. Subsequently, a thermal process is performed to form a p+-polysilicon layer from the p+-amorphous silicon layer. Then the p+-polysilicon layer is patterned and etched to form a gate structure for the PMOS transistor. Next, an ion implantation is used to form source and drain regions aligned with the gate structure in the semiconductor substrate.

In another aspect of the present invention, a complementary symmetry MOS (CMOS) structure is formed. In this embodiment, a N-well and P-well are formed in a semiconductor substrate. A channel stop is then formed in the P-well region by ion implantation. Next, the substrate is thermally oxidized to form field oxide (FOX) regions. A first silicon dioxide layer is formed atop the substrate to serve as the gate oxide. An amorphous silicon layer is then deposition over the FOX regions and the first silicon dioxide layer. The amorphous silicon layer is doped with phosphorus to form a n-type amorphous silicon layer. Subsequently, a tungsten silicide layer is formed over the amorphous silicon layer. A photoresist mask is formed atop the P-well region. Then boron is implanted in the unmasked portion of the amorphous silicon layer to form a p+-arnorphous silicon layer. Next, a thermal process is performed to form polysilicon layers from the amorphous silicon layers. Photolithography and etching processes are performed to form gate structures for the CMOS structure.

Next a second photoresist mask is formed over the entire structure except over the active region of the P-well A lightly doped drain (LDD) doping profile is then formed by ion implantation of an n-type dopant. Next, a second silicon dioxide layer is deposited by CVD. An anisotropic etch is then performed to produce a side wall spacer around the unmasked gate structure. Subsequently, another ion implantation of n-type dopant is performed to form the more heavily doped source and drain regions of the n-channel device of the CMOS structure. The second photoresist is then removed and a third photoresist mask is formed over the resultant structure except over the active region of the N-well. An ion implantation is performed with a p-type dopant to form source and drain regions of the p-channel device of the CMOS structure. The third photoresist is then removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
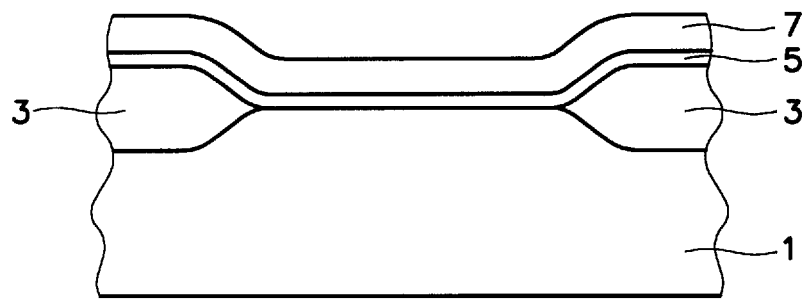
FIG. 1 is a cross-sectional representation illustrating the formation of a silicon dioxide layer and an amorphous silicon layer in accordance with one embodiment of the invention.

FIG. 1 illustrates an early stage in forming a MOS transistor with a $p^+$-polysilicon gate according to one embodiment of the present invention. In this embodiment, a single crystal substrate 1 having p-type with a <100> crystallographic orientation is used. Thick field oxide (FOX) regions 3 are created on the substrate 1 for purposes of isolation. The FOX regions 3 can be formed in any suitable manner. In this embodiment, the FOX regions 3 are formed by forming a silicon nitride-silicon dioxide composition layer on top of the substrate 1, which is then patterned using standard photolithography and dry etching steps. After the photoresist is removed and wet cleaned, a thermal oxidation in an oxygen steam ambient is used to form the FOX 3 regions, to a thickness about 4000–6000 angstroms.

A first silicon dioxide layer 5 is created atop the substrate 1 to serve as the gate oxide 5 for the subsequently formed MOS transistor. In this embodiment, the first silicon dioxide layer 5 is formed by using an oxygen-steam ambient, at a temperature between about 850° to 1000° C. Alternatively, the oxide may be formed using other known oxide chemical compositions and procedures. As is well known in the art, by controlling the pressure and time at which the oxygen-steam ambient is exposed to the substrate, the thickness of the first silicon dioxide layer 5 can be easily controlled. In this embodiment, the thickness of the first silicon dioxide layer 5 is approximately 100 angstroms.

An amorphous silicon layer 7 is then formed over the FOX regions 3 and the first silicon dioxide layer 5 using a low pressure chemical vapor deposition (LPCVD) method. In this embodiment, thickness of the amorphous silicon layer 7 is about 1500–2000 angstroms. The amorphous silicon layer 7 is then doped by diffusion with phosphorus by using a $SiH_4$ and $PH_3$ mixture as a source to form a lightly doped n type (n-) amorphous silicon layer 7. The temperature of the process is about 550° C. and the concentration of the impurities is between about $10^{17}$–$10^{18}$ atoms/cm$^3$.

Figure 2:
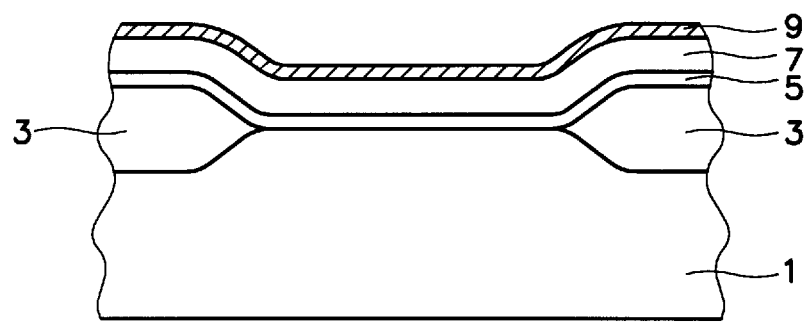
FIG. 2 is a cross-sectional representation illustrating the formation of a tungsten silicide layer in accordance with one embodiment of the invention.

Referring to FIG. 2, a metal silicide layer 9 is formed over the silicon layer 7. The metal silicide layer 9 can be formed from any suitable refractory metal, such as tungsten. In this embodiment, the metal silicide layer 9 is formed to a thickness about 500–1500 angstroms. The metal silicide layer 9 is formed by reacting tungsten fluoride with silane. It is appreciated that the silicide can be formed using other methods is other embodiments. For example, in another embodiment, a titanium (Ti) metal layer is deposited on the wafer having a thickness of about 500–1500 angstroms. Then a rapid thermal process (RTP) is performed so that the metal layer will react with the upper portion of the polysilicon layer to form metal silicide/polysilicon composition layer, i.e., polycide. In other embodiments, the metal layer could be platinum or nickel.

Figure 3:
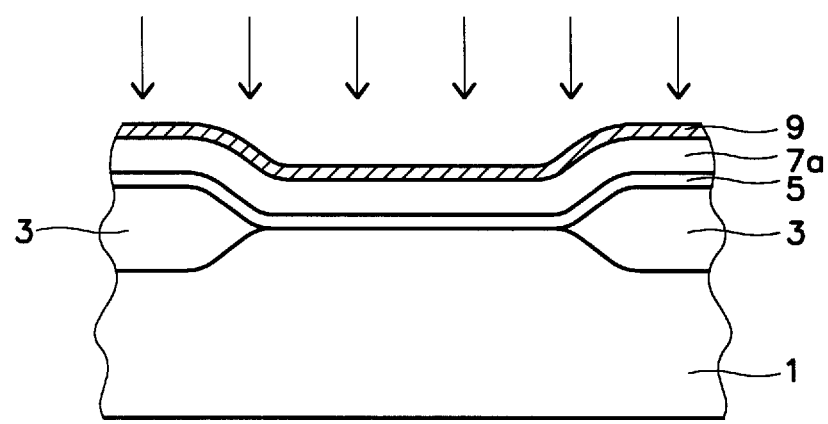
FIG. 3 is a cross-sectional representation illustrating the formation of a doped amorphous silicon layer beneath a tungsten silicide layer in accordance with one embodiment of the invention.

Referring to FIG. 3, an ion implantation is performed to form a $p^+$-amorphous silicon layer 7 (FIG. 2). In this embodiment, the ion source of the implantation is $BF_2$, which is implanted using an energy of about 20–180 KeV and a dosage of at least 6E15 atoms/cm$^2$. Subsequently, a thermal process is performed at a temperature about 700–900° C. The thermal process causes the amorphous silicon layer 7 to form a $p^+$-polysilicon layer 7a. The phosphorus ions in the polysilicon layer from the diffusion help to fix the boron in the polysilicon, thereby reducing the diffusion of the boron and penetration of the boron into the gate oxide.

Figure 4:
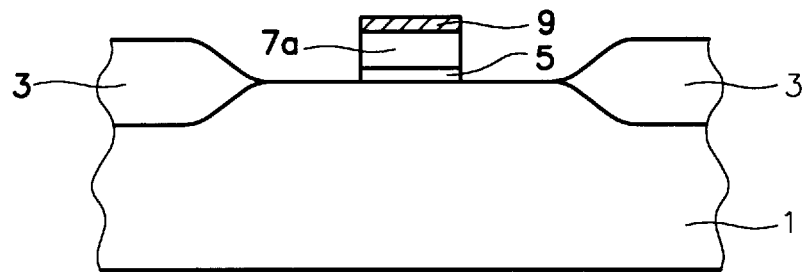
FIG. 4 is a cross-sectional representation illustrating the formation of a gate structure in accordance with one embodiment of the invention.

Turning next to FIG. 4, standard photolithography and etching processes are used to pattern the first silicon dioxide layer 5, the polysilicon layers 7a and tungsten silicide layer 9 to form a gate structure. In this embodiment, the etching step uses a wet etching process. Alternatively, a plasma etching process can be used. The resulting gate structure is shown in FIG. 4.

Figure 5:
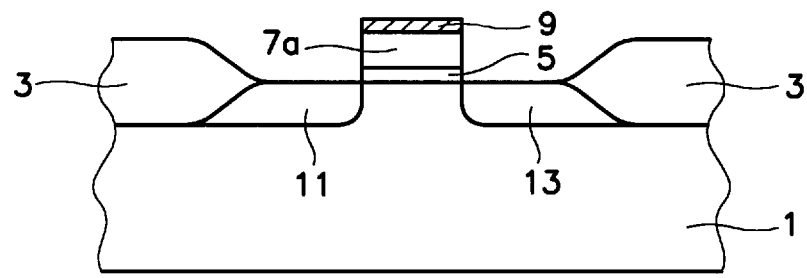
FIG. 5 is a cross-sectional representation illustrating the formation of source and drain in accordance with one embodiment of the invention.

FIG. 5 illustrates a next stage in the method of the present invention. A second ion implantation is used to form source and drain regions 11 and 13. In this embodiment, the source and drain regions 11 and 13 are formed by implanting boron using a dosage of about 4E15 atoms/cm$^2$.

Figure 6:
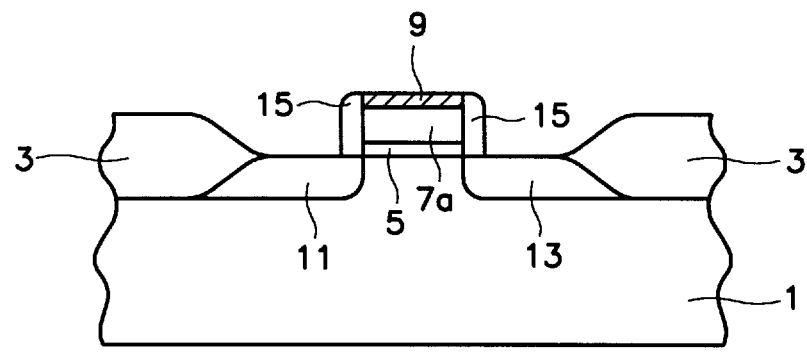
FIG. 6 is a cross-sectional representation illustrating the formation of a side wall spacer in accordance with one embodiment of the invention.

Referring to FIG. 6, a second silicon dioxide layer is deposited over the gate structure, FOX regions 3 and the substrate using a conventional LPCVD process. In this embodiment, the second silicon dioxide layer has a thickness between about 1000–2000 angstroms. An anisotropic etching step is utilized to form a side wall spacer 15 around the gate structure.

Figure 7:
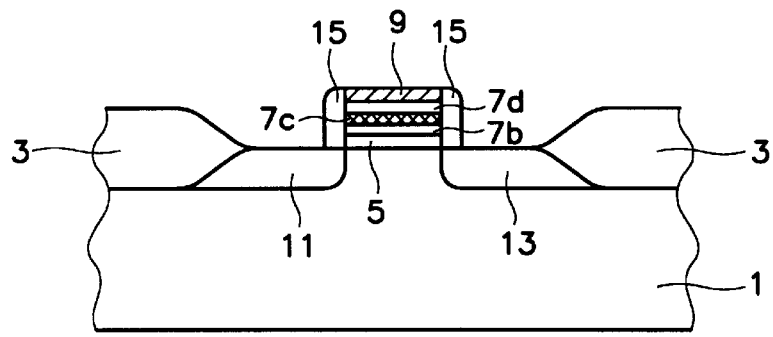
FIG. 7 is a cross-sectional representation illustrating a second embodiment of the present invention.

FIG. 7 shows an alternative embodiment for fabricating the MOS transistor, which is used to reduce migration of residual tungsten from contaminating the gate oxide. In this embodiment, the polysilicon gate is formed from a triple stack of amorphous silicon. A first amorphous silicon layer 7b of lightly doped amorphous silicon is deposited on the gate oxide layer 5. A undoped amorphous silicon layer 7c is then deposited on the first amorphous silicon layer 7b. Next, a third amorphous silicon layer 7d is deposited on the second silicon layer 7c to form a lightly doped silicon/undoped silicon/doped silicon triple composition layer. Subsequently, tungsten is deposited on the composition layer and is then thermally treated to form the tungsten silicide layer 9. Then, the composition layer is doped with boron and thermally treated to form a p$^+$-polysfficon layer.

Figure 8:
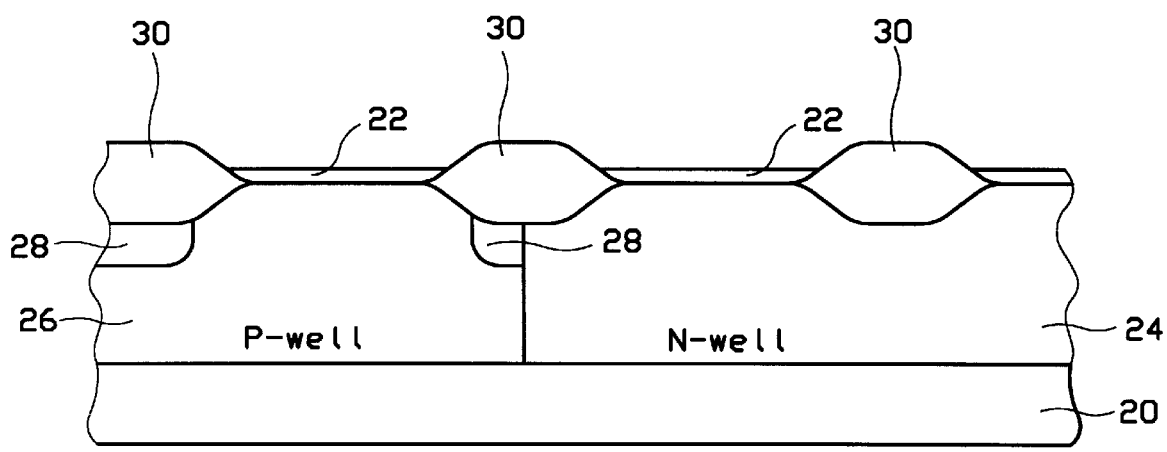
FIG. 8 is a cross-sectional representation illustrating the formation of a P-well and a N-well in accordance with a third embodiment of the invention.

In another embodiment, the present invention is utilized in the manufacture of the CMOS. As shown in FIG. 8, a single crystal polysilicon substrate 20 is shown. In this embodiment, the single crystal substrate 20 is p-type with a <100> crystallographic orientation. A thermal oxidation is used to formed a pad oxide 22. Then a N-well 24 and P-well 26 are formed using any suitable conventional process. In this embodiment, the N-well 24 is formed by an ion implantation of phosphorus. The P-well 26 is formed by an ion implantation of boron. Next, a channel stop 28 is generated in the P-well region 26 by ion implantation. Then the substrate 20 is thermally oxidized to form field oxide (FOX) regions 30, to a thickness of about 5000–8000 angstroms.

Figure 9:
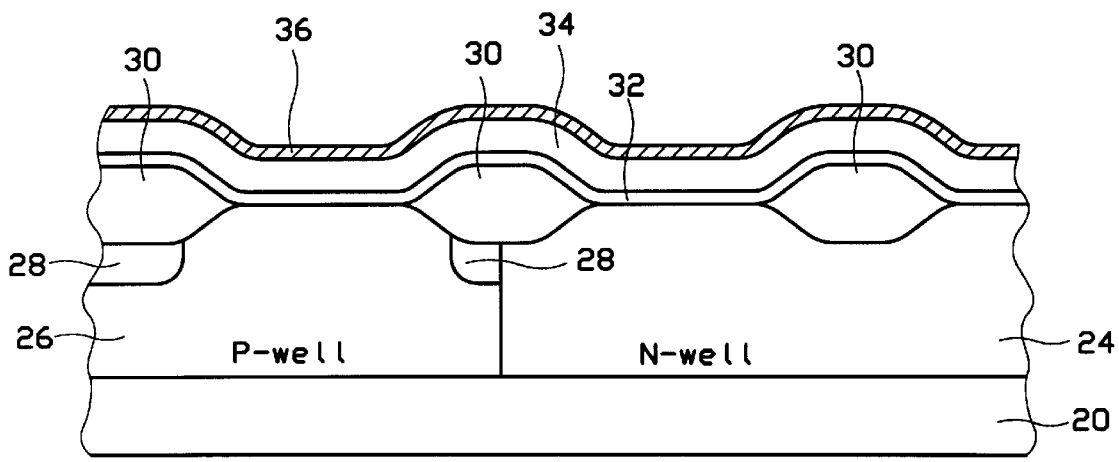
FIG. 9 is a cross-sectional representation illustrating the formation of a silicon dioxide layer, an amorphous silicon layer and a tungsten silicide layer in accordance with the third embodiment of the invention.

Referring to FIG. 9, the pad layer 22 (FIG. 8) is removed by wet etching. A first silicon dioxide layer 32 is then created atop the substrate 20 to serve as a gate oxide 32. In the preferred embodiment, the first silicon dioxide layer 32 is grown using an oxygen-steam ambient at atemperature between about 850–1000° C., to a thickness of about 100 angstroms.

An amorphous silicon layer 34 is then formed over the FOX regions 30 and the first silicon dioxide layer 32 by LPCVD. The amorphous silicon layer 34 is formed to have a thickness between about 1500–2000 angstroms. The amorphous silicon layer 34 is then doped by diffusion with phosphorus by using a SiH$_4$ and PH$_3$ mixture as a source to form a n-type amorphous silicon layer 34. The temperature of the process is about 550° C. and the concentration of the impurities is between about $10^{17}$–$10^{18}$ atoms/cm$^3$. Subsequently, a metal silicide layer 36 is formed over the amorphous silicon layer 34. The metal silicide layer 36 can be formed from any suitable refractory metal, such as tungsten. In this embodiment, the metal silicide layer 36 is formed by reacting tungsten fluoride (WF$_6$) with silane. The tungsten silicide layer 36 has a thickness of about 500–1500 angstroms.

Figure 10:
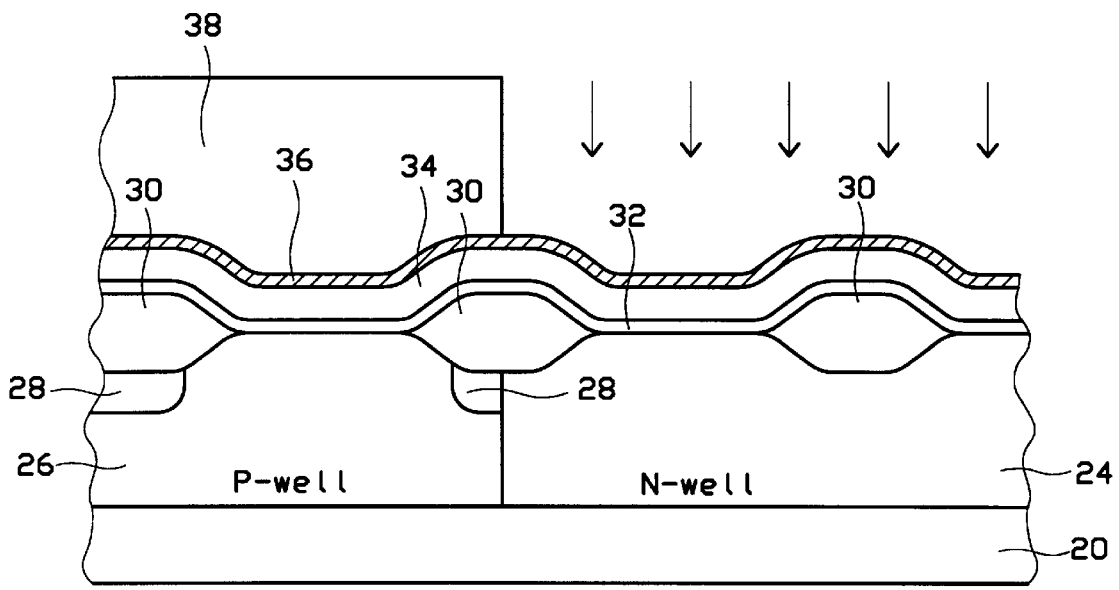
FIG. 10 is a cross-sectional representation illustrating the formation of a doped amorphous silicon layer beneath a tungsten silicide layer and a doped crystalline silicon layer in a N-well region, according to the third embodiment of the invention.

Referring to FIG. 10, a photoresist mask 38 is formed atop the P-well region 26. Subsequently, the amorphous silicon layer 34 is doped with boron by ion implantation so that the amorphous silicon layer 34 is made of p$^+$-amorphous silicon. The ion source of the implantation is BF$_2$. The implantation is performed through the tungsten silicide layer 36 and into the amorphous silicon layer 34. In this embodiment, the energy of the implantation is about 20–180 KeV and the dosage is at least 6E15 atoms/cm$^2$. Subsequently, the photoresist mask 38 is stripped after the ion implantation is completed. Then a thermal process is performed at a temperature of about 700–900° C. The portion of the amorphous silicon layer 34 over the N-well 24 then forms p$^+$-polysilicon, whereas the portion of the amorphous silicon layer 34 over the P-well 26 is converted to n-type polysilicon. The phosphorus ions in the polysilicon layer help to fix the boron in the polysilicon layer, thereby reducing the diffusion of the boron and penetration of the boron into the gate oxide.

Figure 11:
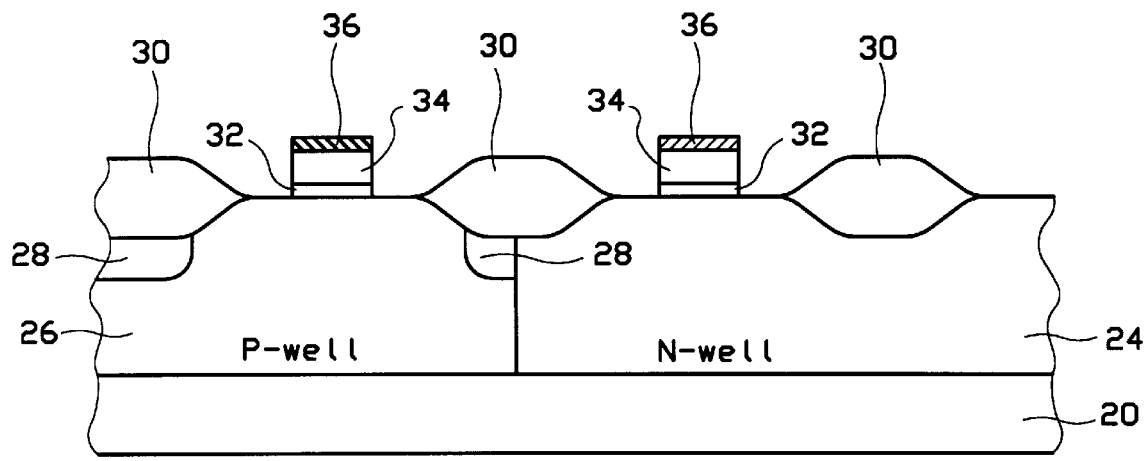
FIG. 11 is a cross-sectional representation illustrating the formation of a gate structure in accordance with the third embodiment of the invention.

Turning next to FIG. 11, standard photolithography and etching processes are used to pattern the first silicon dioxide layer 32, the polysilicon layer 34 and tungsten silicide layer 36. The etching step is performed by either wet or plasma etching. The resulting CMOS gate structures are shown in FIG. 11.

Figure 12:
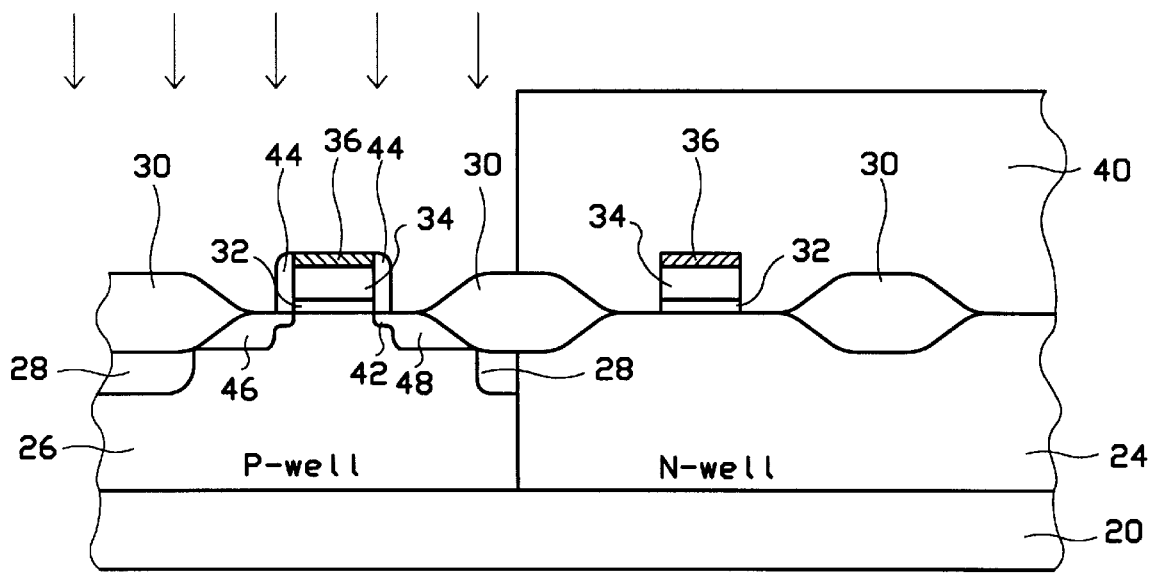
FIG. 12 is a cross-sectional representation illustrating the formation of impurity regions of n channel device in accordance with the third embodiment of the invention.

Turning to FIG. 12, a photoresist mask 40 is formed masking N-well 24, leaving the active region of the P-well 26 unmasked. A lightly doped drain (LDD) 42 is formed in the P-well 26 by an ion implantation of phosphorus. Next, a silicon dioxide layer is deposited by CVD at a temperature about 650–750° C. An anisotropic etch is then performed to produce a side wall spacer 44. Subsequently, a heavy ion implant is performed to form the LDD doping profile of the source region 46 and the drain region 48 of the N-channel device. In this embodiment, arsenic is used in the heavy implant. The photoresist mask 40 is then removed.

Figure 13:
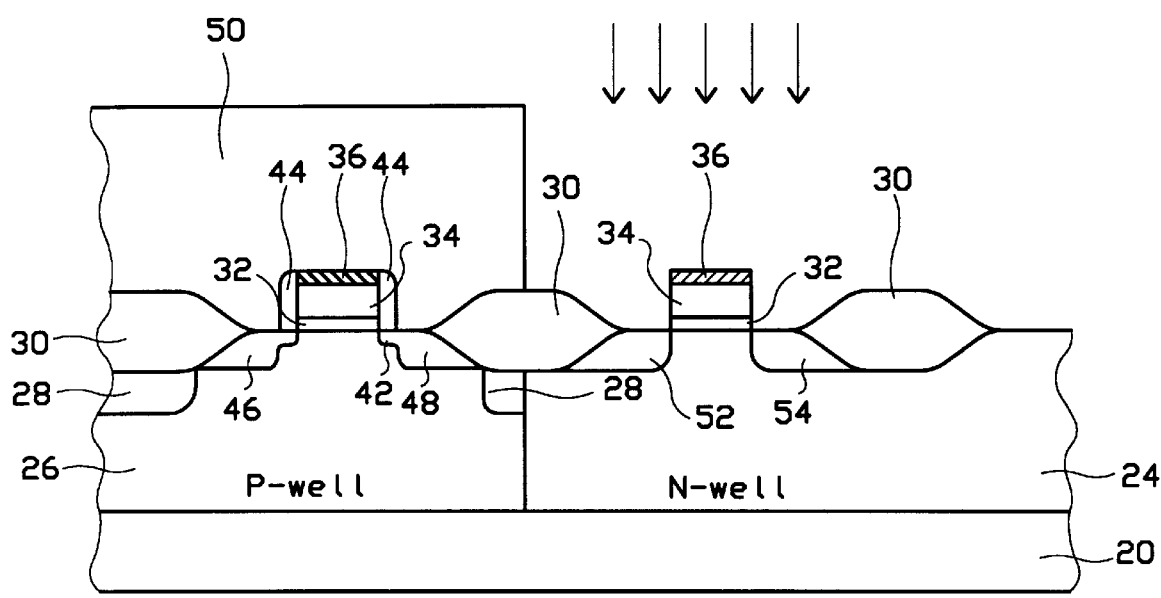
FIG. 13 is a cross-sectional representation illustrating the formation of impurity regions of p channel device in accordance with the third embodiment of the invention

Turning next to FIG. 13, the N-well 24 is then masked with a photoresist 50. An ion implantation is performed to form source 52 and drain 54 of the P-channel device. In this embodiment, boron is used in the implantation. The photoresist 50 is then stripped. The phosphorus ions in the polysilicon gate of the p-channel device help to fix the boron ions in the polysilicon gate, thereby reducing the diffusion of the boron ions and penetration of the boron into the gate oxide.

The embodiments described above are intended to be illustrative of the principles of the present invention rather than limiting the invention to the described embodiments. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of manufacturing a PMOS transistor having a p$^+$-polysilicon gate, the method comprising:

forming a silicon dioxide layer on a semiconductor substrate;

forming a first doped silicon layer on said silicon dioxide layer, said first doped silicon layer comprising n-amorphous silicon;

forming a undoped silicon layer on said first doped silicon layer, said undoped silicon layer comprising undoped amorphous silicon;

forming second doped silicon layer on said silicon dioxide layer, said second doped silicon layer comprising n-amorphous silicon;

forming a tungsten silicide layer on said second doped silicon layer;

doping said first doped, said undoped and said second doped silicon layers with a p-type dopant, wherein said first doped silicon, said undoped and said second doped silicon layers comprise p$^+$-amorphous silicon;

thermally treating said first doped, said undoped and said second doped silicon layers to convert said amorphous silicon of said first doped, said undoped and said second doped silicon layers to polysilicon;

patterning and etching said metal silicide layer, said first doped, said undoped and said second doped silicon layers and said silicon dioxide layer to form a gate structure; and forming source and drain regions in said substrate using ion implantation of p-type dopants, said metal silicide layer serving as an implant mask.

2. The method of claim 1, wherein said first doped silicon layer is doped by diffusion with phosphorus using a SiH$_4$ and PH$_3$ mixture as a source.

3. The method of claim 1, wherein said first and second doped silicon layers have a dopant concentration of about $10^{17}$–$10^{18}$ atoms/cm$^3$.

4. The method of claim 1, wherein said second doped silicon layer is doped by diffusion with phosphorus using a $SiH_4$ and $PH_3$ mixture as a source.

5. The method of claim 1, wherein the dosage of said implantation to form p-silicon layer is higher than 6E15 atoms/cm$^2$.

6. The method of claim 1, wherein said thermally treating said first doped, said undoped and said second doped silicon layers is performed using a temperature of about 700–900° C.

* * * * *